US012052802B2

United States Patent
Ka et al.

(10) Patent No.: US 12,052,802 B2
(45) Date of Patent: Jul. 30, 2024

(54) FLEXIBLE DISPLAY PANEL AND DISPLAY APPARATUS INCLUDING THE SAME

(71) Applicant: SAMSUNG DISPLAY CO., LTD., Yongin-si (KR)

(72) Inventors: Ji-Hyun Ka, Yongin-si (KR); Won-Kyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/346,748

(22) Filed: Jul. 3, 2023

(65) Prior Publication Data
US 2023/0345595 A1 Oct. 26, 2023

Related U.S. Application Data

(60) Continuation of application No. 17/392,183, filed on Aug. 2, 2021, now Pat. No. 11,696,377, which is a
(Continued)

(30) Foreign Application Priority Data

Jun. 27, 2012 (KR) .................. 10-2012-0069471

(51) Int. Cl.
*H05B 33/22* (2006.01)
*G06F 1/16* (2006.01)
(Continued)

(52) U.S. Cl.
CPC ........... *H05B 33/22* (2013.01); *G06F 1/1601* (2013.01); *G06F 1/1637* (2013.01);
(Continued)

(58) Field of Classification Search
CPC ....... H05B 33/22; H05B 33/04; G06F 1/1601; G06F 1/1637; G06F 3/041; G06F 3/0412
See application file for complete search history.

(56) References Cited

U.S. PATENT DOCUMENTS 7,453,700 B2 11/2008 Miyata
7,460,194 B2 12/2008 Tsukamoto
(Continued)

FOREIGN PATENT DOCUMENTS

JP 11-272205 A 10/1999
JP 4357868 B2 8/2009
(Continued)

OTHER PUBLICATIONS

Korean Decision on Registration dated Mar. 11, 2020, for the corresponding Korean Patent Application No. 10-2018-0172789, 3 pages.

*Primary Examiner* — Joseph L Williams
(74) *Attorney, Agent, or Firm* — Lewis Roca Rothgerber Christie LLP

(57) ABSTRACT

A flexible display panel and a display apparatus including the flexible display panel are disclosed. The flexible display panel includes an encapsulated panel, a first protective film on one side of the encapsulated panel, and a second protective film on another side of the encapsulated panel. The encapsulated panel includes a flexible panel and a flexible encapsulation member on the flexible panel. The flexible panel includes a first region on a first plane and that includes a display region, and a second region on a second plane that is bent with respect to the first plane and that includes a non-display region. The flexible encapsulation member encapsulates the display region. The display apparatus also includes a support unit for maintaining a shape of the flexible panel.

20 Claims, 15 Drawing Sheets

Related U.S. Application Data continuation of application No. 16/803,932, filed on Feb. 27, 2020, now Pat. No. 11,083,054, which is a division of application No. 16/157,030, filed on Oct. 10, 2018, now Pat. No. 10,616,972, which is a continuation of application No. 15/831,250, filed on Dec. 4, 2017, now Pat. No. 10,111,301, which is a continuation of application No. 15/423,400, filed on Feb. 2, 2017, now Pat. No. 9,839,096, which is a continuation of application No. 15/203,785, filed on Jul. 6, 2016, now Pat. No. 9,565,738, which is a continuation of application No. 14/821,621, filed on Aug. 7, 2015, now Pat. No. 9,414,463, which is a continuation of application No. 13/740,076, filed on Jan. 11, 2013, now Pat. No. 9,104,368.

(51) Int. Cl.

| | | |
|---|---|---|
| *G06F 3/041* | (2006.01) | |
| *H01L 27/32* | (2006.01) | |
| *H01L 51/00* | (2006.01) | |
| *H01L 51/52* | (2006.01) | |
| *H05B 33/04* | (2006.01) | |
| *H10K 50/844* | (2023.01) | |
| *H10K 59/131* | (2023.01) | |
| *H10K 77/10* | (2023.01) | |
| *G02F 1/1333* | (2006.01) | |
| *H10K 102/00* | (2023.01) | |

(52) U.S. Cl.
CPC .......... *G06F 1/1643* (2013.01); *G06F 1/1652* (2013.01); *G06F 3/041* (2013.01); *G06F 3/0412* (2013.01); *H05B 33/04* (2013.01); *H10K 50/844* (2023.02); *H10K 59/131* (2023.02); *H10K 77/111* (2023.02); *G02F 1/133308* (2013.01); *G06F 2203/04102* (2013.01); *H10K 2102/311* (2023.02); *Y02E 10/549* (2013.01)

(56) References Cited

U.S. PATENT DOCUMENTS

| | | |
|---|---|---|
| 11,083,054 B2 | 8/2021 | Ka et al. |
| 2011/0007042 A1 | 1/2011 | Miyaguchi |
| 2011/0050657 A1 | 3/2011 | Yamada |
| 2011/0163330 A1 | 7/2011 | Kim et al. |
| 2013/0002583 A1 | 1/2013 | Jin et al. |
| 2013/0032414 A1 | 2/2013 | Yilmaz et al. |
| 2013/0063891 A1 | 3/2013 | Martisauskas |
| 2013/0135548 A1 | 5/2013 | Burberry et al. |

FOREIGN PATENT DOCUMENTS

| | | |
|---|---|---|
| JP | 2011-47977 A | 3/2011 |
| JP | 2011-138748 A | 7/2011 |
| KR | 10-2007-0003118 A | 1/2007 |
| KR | 10-0714348 B1 | 5/2007 |
| KR | 10-0754068 B1 | 8/2007 |
| KR | 10-2008-0054175 A | 6/2008 |
| KR | 10-2011-0067405 A | 6/2011 |
| WO | WO 2004/047059 A1 | 6/2004 |

FLEXIBLE DISPLAY PANEL AND DISPLAY APPARATUS INCLUDING THE SAME

CROSS-REFERENCE TO RELATED PATENT APPLICATIONS

This application is a continuation of U.S. patent application Ser. No. 17/392,183, filed Aug. 2, 2021, which is a continuation of U.S. patent application Ser. No. 16/803,932, filed Feb. 27, 2020, now U.S. Pat. No. 11,083,054, which is a divisional of U.S. patent application Ser. No. 16/157,030, filed Oct. 10, 2018, now U.S. Pat. No. 10,616,972, which is a continuation of U.S. patent application Ser. No. 15/831,250, filed Dec. 4, 2017, now U.S. Pat. No. 10,111,301, which is a continuation of U.S. patent application Ser. No. 15/423,400, filed Feb. 2, 2017, now U.S. Pat. No. 9,839,096, which is a continuation of U.S. patent application Ser. No. 15/203,785, filed Jul. 6, 2016, now U.S. Pat. No. 9,565,738, which is a continuation of U.S. patent application Ser. No. 14/821,621, filed Aug. 7, 2015, now U.S. Pat. No. 9,414,463, which is a continuation of U.S. patent application Ser. No. 13/740,076, filed Jan. 11, 2013, now U.S. Pat. No. 9,104,368, which claims priority to and the benefit of Korean Patent Application No. 10-2012-0069471, filed Jun. 27, 2012, the entire contents of all of which are incorporated herein by reference.

BACKGROUND

1. Field

Aspects of embodiments of the present invention relate to a flexible display panel and a display apparatus including the flexible display panel.

2. Description of the Related Art

Display apparatuses refer to apparatuses that display an image signal. Such display apparatuses include all apparatuses that display an image signal input by an external device, such as televisions (TVs), computer monitors, personal digital assistants (PDAs), and smart devices that are increasingly in demand. A flat panel display module with high image quality, such as an organic light-emitting display panel, a liquid crystal display (LCD) panel, a plasma display panel (PDP), or the like, is used in display apparatuses.

The flat panel display module includes a display region where an image is displayed, and a non-display region where various circuits and wirings for supplying an image signal to the display region are located. The non-display region is outside the display region and on the same plane with the display region. As demand for high image quality and various applications of display apparatuses has recently increased, the number of circuits and wirings located in a non-display region of a flat panel display module has also increased. Thus, the area of the non-display region has increased, which has caused a reduction in the percentage of the display region that is seen or recognized by a user.

SUMMARY

Embodiments of the present invention provide for a flexible display panel that has a reduced area ratio of non-display regions to a display region seen or recognized by a user, and reduces or prevents wirings from cracking due to a bending stress. Further embodiments provide for a display apparatus including the flexible display panel.

According to an exemplary embodiment of the present invention, a flexible display panel is provided. The flexible display panel includes an encapsulated panel, a first protective film on one side of the encapsulated panel, and a second protective film on another side of the encapsulated panel. The encapsulated panel includes: a flexible panel including a first region on a first plane and that includes a display region, and a second region on a second plane that is bent with respect to the first plane and that includes a non-display region; and a flexible encapsulation member on the flexible panel to encapsulate the display region.

The first protective film and the second protective film may completely cover the display region and the non-display region.

The display region may be configured to display in a first direction in which the first plane is facing. The non-display region may not face the first direction.

An area ratio of the non-display region to the display region as observed from a first direction in which the first plane is facing when the flexible display panel is not bent, may be smaller than an area ratio of the non-display region to the display region as observed from the first direction when the flexible display panel is bent.

The flexible panel may further include a border region between the first region and the second region. The border region may have a curved surface having a curvature radius.

The curvature radius may be constant.

The curvature radius may be between 0.01 mm and 10 mm.

The curved surface may have an arc shape.

The display region may extend into the border region.

The non-display region may extend into the border region.

The display region may extend into the border region.

The flexible panel may further include a third region on a third plane that is substantially parallel to the first plane and that extends from an end of the second region.

The non-display region may extend into the third region from the second region.

The third region may include a pad unit.

The flexible display may further include a barrier layer between the flexible panel and the flexible encapsulation member.

The first protective film and the second protective film may be symmetrical with each other.

The first protective film or the second protective film may include a polarization film.

The first protective film may cover an end of the flexible panel and the second protective film may cover an end of the flexible encapsulation member.

The flexible encapsulation member may include an insulating layer including an inorganic layer or an organic layer.

The flexible display panel may further include a touch panel on the flexible panel or the flexible encapsulation member, and configured to display an image of the display region.

The touch panel may include a flexible film that is bent to correspond to a shape of the flexible display panel.

The touch panel may include a touch region on the flexible film and corresponding to the display region; and a wiring region outside the touch region.

According to another exemplary embodiment of the present invention, a display apparatus is provided. The display apparatus includes: an encapsulated panel including a flexible panel and a flexible encapsulation member on the flexible panel to encapsulate a display region of the flexible panel; a first protective film on one side of the encapsulated panel; a second protective film on another side of the encapsulated panel; and a support unit for maintaining a shape of the flexible panel. The flexible panel includes a first region on a first plane and that includes a display region, and a second region on a second plane that is bent with respect to the first plane and that includes a non-display region.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
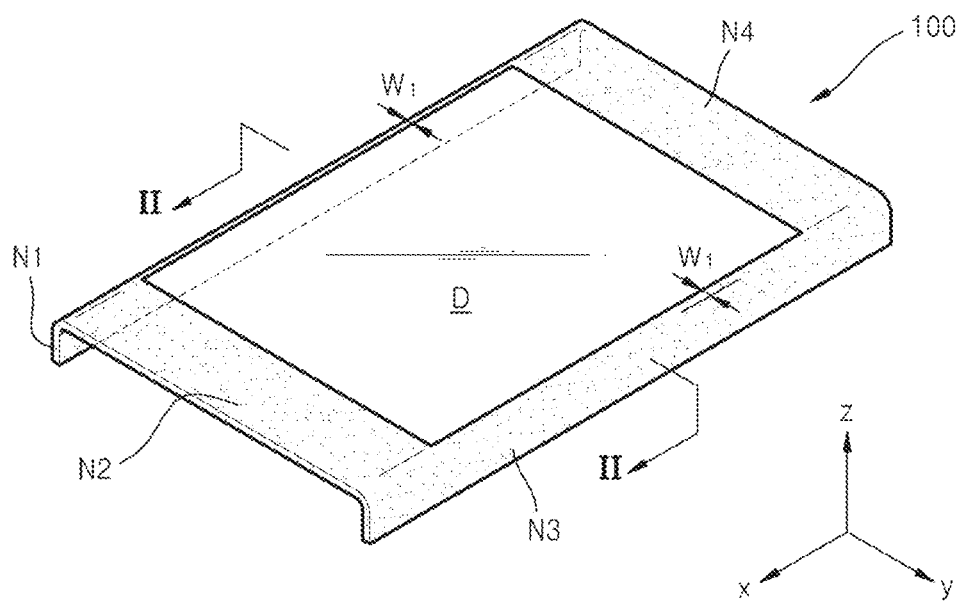
FIG. 1 is a schematic perspective view of a flexible display panel according to an embodiment of the present invention.

The present invention will now be described more fully with reference to the accompanying drawings in which exemplary embodiments of the invention are shown. Expressions such as "at least one of," when preceding a list of elements, modify the entire list of elements and do not modify the individual elements of the list. In addition, like reference numerals refer to like elements throughout.

Figure 2:
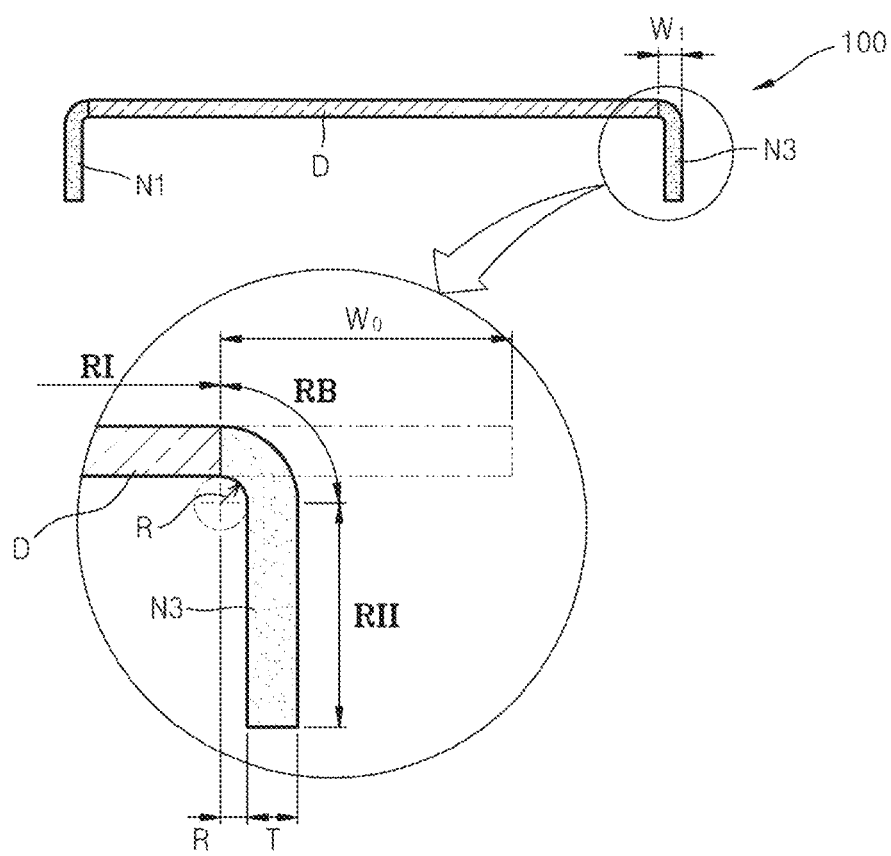
FIG. 2 is a cross-sectional view of the flexible display panel of FIG. 1 taken along the line II-II.

FIG. 1 is a schematic perspective view of a flexible display panel 100 according to an embodiment of the present invention. FIG. 2 is a cross-sectional view of the flexible display panel 100 of FIG. 1 taken along the line II-II.

Referring to FIGS. 1 and 2, the flexible display panel 100 includes a display region D on a first plane (x-y plane) and non-display regions N1, N2, N3, and N4 that are located outside the display region D. The non-display regions N1 and N3 are on a second plane (x-z plane) that is bent with respect to the first plane (x-y plane). The non-display regions N1 and N3 that face each other across the display region D in left and right directions among the non-display regions N1, N2, N3, and N4 are bent in a direction (−z) opposite to a direction (z) in which the display region D is displayed. Since the non-display regions N1 and N3 are bent in the direction (−z) opposite to the direction (z) in which the display region D is displayed, when a user looks at the flexible display panel 100 from the front direction (z) of the display region D, the user sees or recognizes a width $W_1$ of a portion of the flexible display panel 100 in which the non-display regions N1 and N3 are bent as a border that surrounds or bounds left and right sides of the display region D.

Referring to FIG. 2, since the width $W_1$ of the portion of the flexible display panel 100 in which the non-display regions N1 and N3 are bent becomes much smaller than an original (unbent) width $W_0$ of the non-display regions N1 and N3, the user sees or recognizes that the border of the display region D formed by the non-display regions N1 and N3 is significantly decreased in size. If there is no change in the area of the display region D before and after bending the non-display regions N1 and N3, an area ratio of the non-display regions N1 and N3 to the display region D seen or recognized by the user is decreased, and thus, the user perceives a relative enlarging of the display region D. Since a width of the display region D is enlarged (relatively speaking) due to the decreased width ($W_0$-$W_1$) of the non-display regions N1 and N3, when the flexible display panel 100 is used in a display apparatus, the flexible display panel 100 allows implementation of an enlarged image screen compared to other display panels.

The width $W_1$ of the portion of the flexible display panel 100 in which the non-display regions N1 and N3 are bent is the sum of an inner curvature radius R of a portion where the non-display regions N1 and N3 are bent and a thickness T of the flexible display panel 100. As described below, the inner curvature radius R of the portion of the flexible display panel 100 where the non-display regions N1 and N3 are bent and the thickness T of the flexible display panel 100 may be significantly reduced and thus, the user may see or recognize a borderless display region D due to the configuration of the non-display regions N1 and N3.

Figure 3:
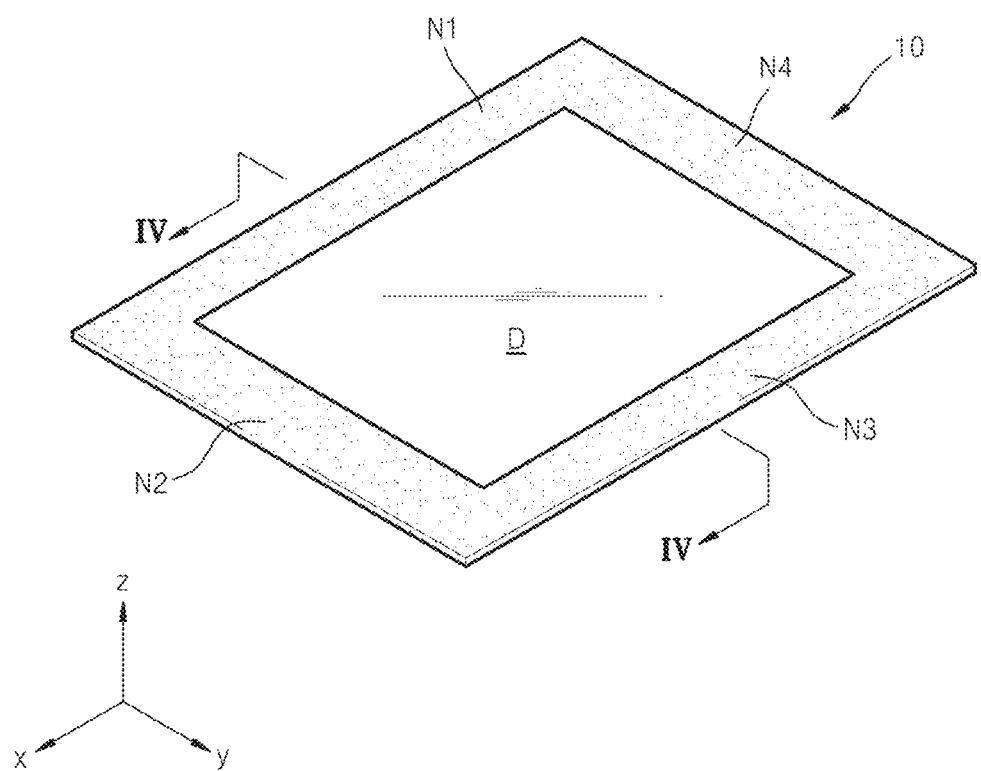
FIG. 3 is a schematic perspective view of a comparative example of a flat display panel in which non-display regions are not bent.
Figure 4:
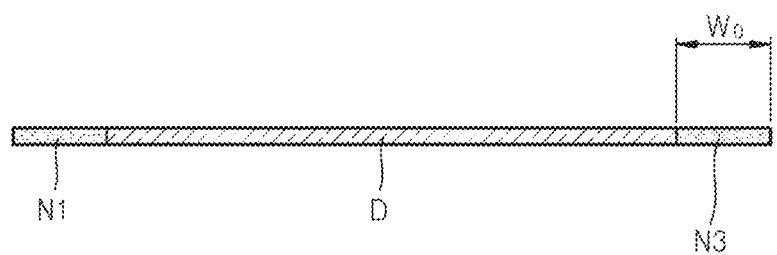
FIG. 4 is a cross-sectional view of the flat display panel of FIG. 3 taken along the line IV-IV.

FIG. 3 is a schematic perspective view of a comparative example of a flat display panel 10 in which non-display regions N1, N2, N3, and N4 are not bent. FIG. 4 is a cross-sectional view of the flat display panel 10 of FIG. 3 taken along the line IV-IV.

Referring to FIGS. 3 and 4, the flat display panel 10 includes a display region D and the non-display regions N1, N2, N3, and N4 outside the display region D. Since the non-display regions N1 and N3 are not bent, when the user looks at the flat display panel 10 from the front (z) of the display region D, the user sees or recognizes the original width $W_0$ of the non-display regions N1 and N3 as a border that surrounds or bounds left and right sides of the display region D. Thus, a wider border of the display region D formed by the non-display regions N1 and N3 is seen or recognized by the user compared to the flexible display panel 100 of FIG. 1 described above.

When the areas of the display region D and the non-display regions N1 and N3 (before bending) of the flexible display panel 100 of FIG. 1 are the same as the areas of the display region D and the non-display regions N1 and N3 of the flat display panel 10 of FIGS. 3 and 4, an area ratio of the non-display regions N1 and N3 to the display region D seen or recognized by the user is decreased compared to the flat display panel 10 of the comparative example so that a larger display screen is perceived.

In order to reduce the area of the non-display regions N1 and N3 in the flat display panel 10, the number or sizes (e.g., line widths) of various circuits or wirings located in the non-display regions N1 and N3 has to be decreased. However, because demand for large image size and/or high image quality for various applications of a display apparatus has increased, there is a limit to how far the number of circuits or wirings can be decreased. In addition, there is a process difficulty in reducing the sizes, such as the line widths, of the circuits or wirings. However, in the flexible display panel 100 of FIG. 1, the area of the non-display regions N1 and N3 seen or recognized by the user is decreased without reducing the number of circuits or wirings located in the non-display regions N1 and N3 and without reducing the sizes (for example, line widths) of the circuits or wirings.

Figure 5:
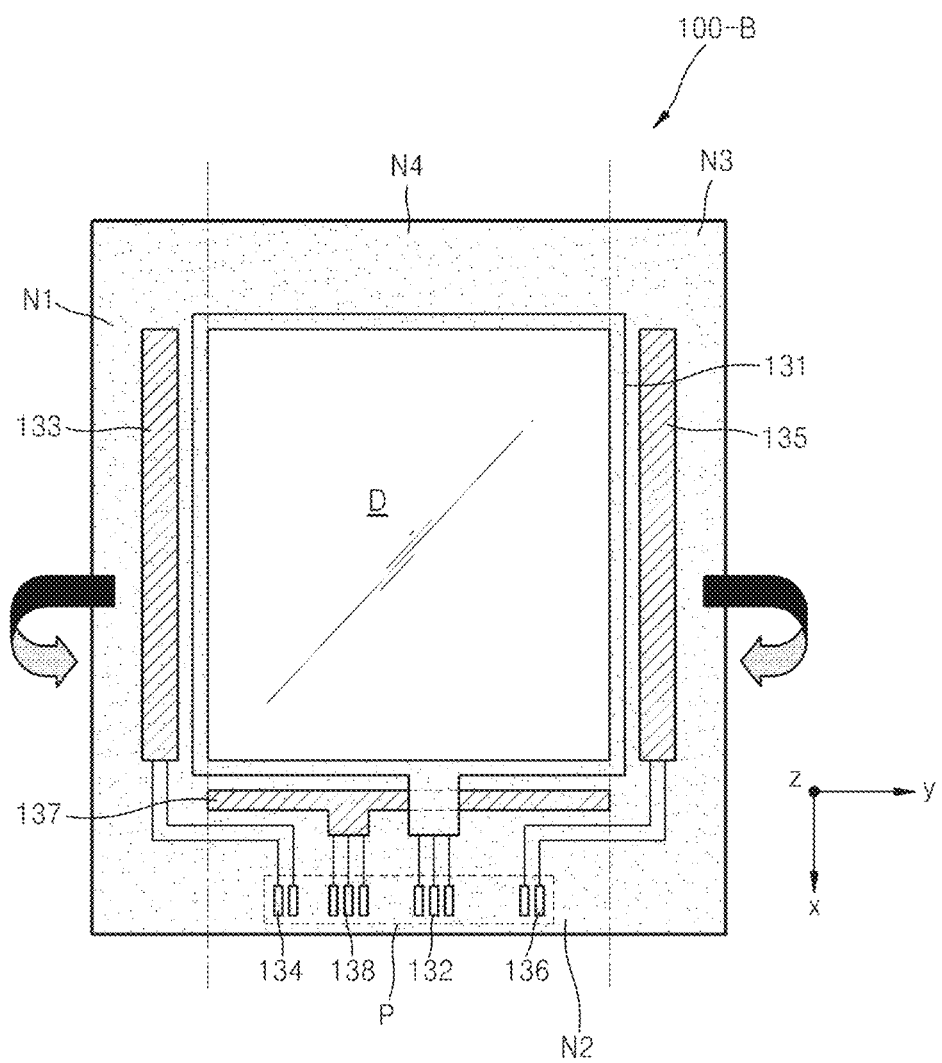
FIG. 5 is a schematic plan view of an example of the flexible display panel of FIG. 1 before bending non-display regions.
Figure 6:
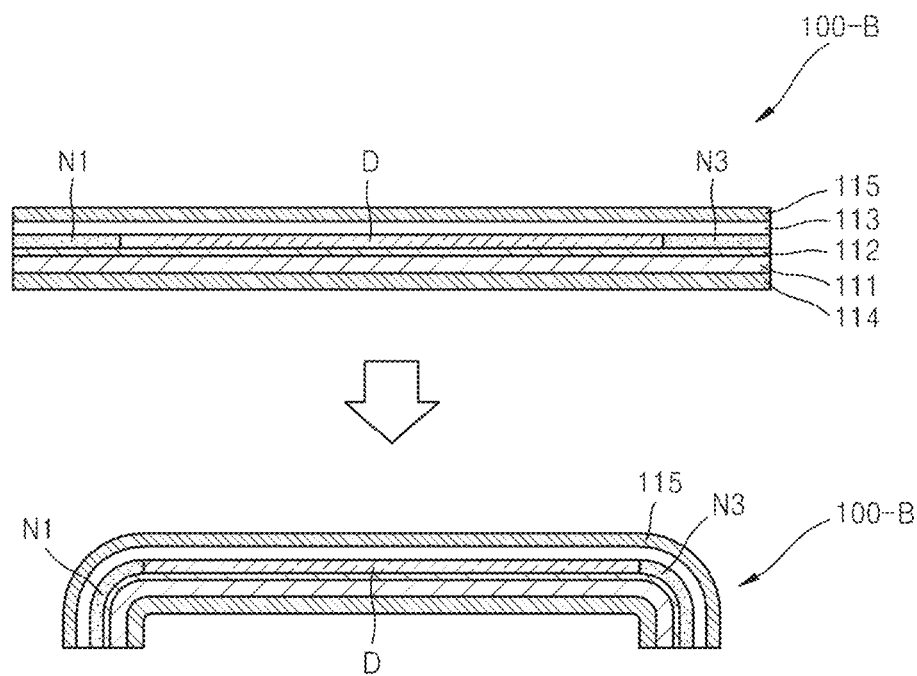
FIG. 6 is a cross-sectional view of the flexible display panel of FIG. 5 before and after bending the non-display regions.
Figure 7:
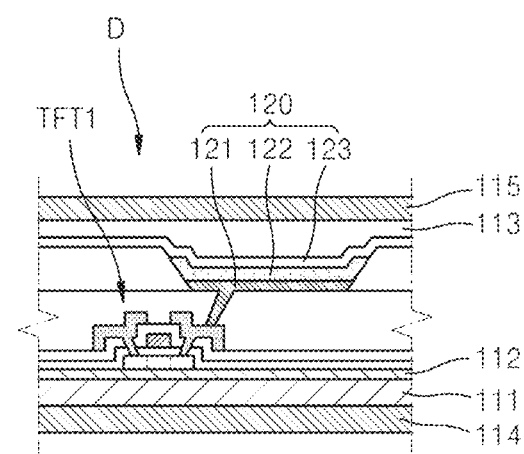
FIG. 7 is a cross-sectional view of an example of a display region of the flexible display panel of FIG. 5.

FIG. 5 is a schematic plan view of a flexible display panel 100-B, which is an example of the flexible display panel 100 of FIG. 1 before bending the non-display regions N1 and N3. FIG. 6 is a cross-sectional view of the flexible display panel 100-B of FIG. 5 before and after bending the non-display regions N1 and N3. FIG. 7 is a cross-sectional view of an example of the display region D of the flexible display panel 100-B of FIG. 5.

Referring to FIGS. 5 through 7, before bending the non-display regions N1 and N3, the flexible display panel 100-B includes a flexible substrate 111, a barrier layer 112 on the flexible substrate 111, the display region D and the non-display regions N1, N2, N3, and N4 that are on the barrier layer 112, a flexible encapsulation member 113, a first protective film 114 on one side of the flexible substrate 111, and a second protective film 115 on one side of the flexible encapsulation member 113. The flexible substrate 111 may be formed of a plastic material having excellent heat-resisting property and durability, such as polyethylene ether phthalate, polyethylene naphthalate, polycarbonate, polyarylate, polyetherimide, polyethersulfone, polyimide, or the like. However, the present invention is not limited thereto, and in other embodiments, the flexible substrate 111 may be formed of various flexible materials.

The barrier layer 112 is on the flexible substrate 111. The barrier layer 112 may be formed of at least one of an inorganic layer or an organic layer. The barrier layer 112 reduces or prevents unnecessary components from passing into the flexible substrate 111 and from permeating into the display region D. The display region D and the non-display regions N1, N2, N3, and N4 outside the display region D are on the barrier layer 112.

An image signal is displayed in the display region D, and various display devices, such as organic light-emitting display devices, liquid crystal display (LCD) devices, electrophoresis display devices, and the like may be located in the display region D. In the embodiment of FIG. 7, an organic light-emitting device 120 is described. Various devices, such as thin film transistors (TFTs) and capacitors for driving the devices, and the like may also be located in the display region D.

At least one organic light-emitting device 120 is located in the display region D. The organic light-emitting device 120 in FIG. 7 includes a pixel electrode 121, an opposite electrode 123 that is a common layer, and an organic emission layer 122 between the pixel electrode 121 and the opposite electrode 123. The pixel electrode 121 is electrically connected to a driving thin film transistor TFT1 located on the flexible substrate 111. The organic light-emitting device 120 may be electrically connected to at least one switching thin film transistor and storage capacitor, thereby emitting light from the display region D.

Light is emitted from the organic emission layer 122 toward the flexible substrate 111 or the flexible encapsulation member 113. In the embodiment of FIG. 7, a top-emission type display device in which an image is displayed towards the flexible encapsulation member 113 is described. However, the present invention is not limited thereto and in other embodiments may be applied to a bottom-emission type display device in which an image is displayed towards the flexible substrate 111. In the bottom-emission type display device, the non-display regions N1 and N3 are bent in a direction (z) opposite to a direction (−z) in which an image is displayed, that is, toward a direction (z) of the flexible encapsulation member 113. Various circuit units and wirings for supplying an image signal to the display device in the display region D may be located in the non-display regions N1, N2, N3, and N4.

Referring to FIG. 5, an electrode power supply line 131 for supplying power to the opposite electrode 123, and a terminal portion 132 of the electrode power supply line 131 are located in the non-display regions N1, N2, N3, and N4. A scan circuit unit 133 for transmitting a driving signal to the display region D, and a terminal portion 134 of the scan circuit unit 133 are located in the non-display regions N1 and N2. A data circuit unit 135 for transmitting a data signal to the display region D, and a terminal portion 136 of the data circuit unit 135 are located in the non-display regions N2 and N3. A driving power wiring unit 137 for supplying driving power to the display region D, and a terminal portion 138 of the driving power wiring unit 137 are located in the non-display region N2. A pad unit P, including the terminal portions 132, 134, 136, and 138, is located in the non-display region N2.

Various circuits, wirings, and terminal portions illustrated in FIG. 5 are just illustrative of examples of components of the non-display regions N1, N2, N3, and N4. In other embodiments, various circuits, wirings, and terminal portions located in the non-display regions N1, N2, N3, and N4 may have a different configuration from that of FIG. 5.

The flexible encapsulation member 113 for encapsulating at least the display region D may also encapsulate parts of or all of the non-display regions N1, N2, N3, and N4. The flexible encapsulation member 113 may be an encapsulation thin layer. The encapsulation thin layer may have a structure including a plurality of inorganic insulating layers or a structure in which an inorganic insulating layer and an organic insulating layer are alternately stacked.

The first protective film 114 is located on one side of the flexible substrate 111. An adhesive may be injected between the flexible substrate 111 and the first protective film 114. The second protective film 115 is located on the other side of the flexible encapsulation member 113. An adhesive may be injected between the flexible encapsulation member 113 and the second protective film 115. The first protective film 114 and the second protective film 115 may have the same physical properties and may reinforce a structural strength of the flexible display panel 100. The first protective film 114 and the second protective film 115 may be formed of a flexible material.

In addition, at least one of the first protective film 114 or the second protective film 115 may have a polarization function (for example, a polarization film). In this case, a position of a protective film having a polarization function corresponds to a direction in which the organic light-emitting device 120 emits light. For example, if the organic light-emitting device 120 is a top-emission type device, that is, if the organic light-emitting device 120 emits light toward the second protective film 115 to display an image, the second protective film 115 may have a polarization function. On the other hand, if the organic light-emitting device 120 is a bottom-emission type display device, that is, if the organic light-emitting device 120 emits light toward the first protective film 114 to display an image, the first protective film 114 may have a polarization function. In addition, if the organic light-emitting device 120 is a double-side emission type device, both the first protective film 114 and the second protective film 115 may have a polarization function.

Figure 8:
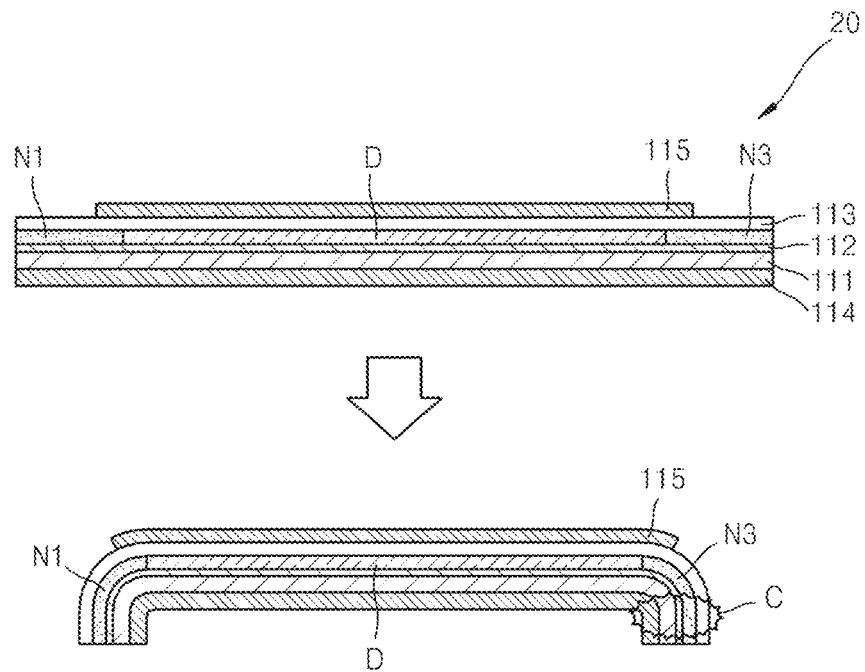
FIG. 8 is a cross-sectional view of a comparative example of a flat display panel before and after bending non-display regions.

FIG. 8 is a cross-sectional view of a comparative example of a flat display panel 20 before and after bending non-display regions N1 and N3.

In the flat panel display 20, the second protective film 115 has a polarization function and the first protective film 114 completely covers the flexible substrate 111. However, the second protective film 115 only completely covers the display region D, as shown in FIG. 8, while leaving portions of the non-display regions N1 and N3 uncovered. When the flat display panel 20 is bent, since bending moments applied to the non-display regions N1 and N3 are different between a portion of the flat display panel 20 where the second protective film 115 is located and a portion of the flat display panel 20 without the second protective film 115, a crack may occur in regions C including a metal layer such as various circuits and wirings constituting the non-display regions N1 and N3 between the portion of the flat display panel 20 where the second protective film 115 is located and the portion of the flat display panel 20 without the second protective film 115. The crack may cause abnormal lighting, and thus, failure is likely to occur.

To reduce or prevent this problem, as shown in FIG. 6, the first protective film 114 and the second protective film 115 cover the non-display regions N1 and N3 as well as the display region D of the flexible display panel 100. The first protective film 114 and the second protective film 115 may be arranged to be symmetrical with each other. For example, the first protective film 114 may cover both ends of the flexible substrate 111 and the second protective film 115 may cover both ends of the flexible encapsulation member 113. By using this structure, bending moments (such as bending moments applied to a region including the metal layer that constitute various circuits and wirings that make up the non-display regions N1 and N3 and that are bent at a border with the display region D) may be the same, thereby reducing or preventing the region including the metal layer from being damaged or cracking.

Since the flexible substrate 111 included in the flexible display panel 100 is flexible, it may be difficult to form the display region D and the non-display regions N1 and N3 directly on the flexible substrate 111. Thus, a method of manufacturing the flexible display panel 100 may include forming the flexible substrate 111 on a rigid glass substrate, forming the barrier layer 112 on the flexible substrate 111, forming the display region D and the non-display regions N1 and N3 on the barrier layer 112, forming the flexible encapsulation member 113 to cover the display region D, adhering the second protective film 115 onto the flexible encapsulation member 113 by using a second adhesive, separating the rigid glass substrate from the flexible substrate 111, and adhering the first protective film 114 onto the flexible substrate 111 by using a first adhesive. The first protective film 114 and the second protective film 115 may also be applied to other embodiments that are described below.

The non-display regions N1 and N3 on left and right portions of the display region D of the flexible display panel 100-B shown in FIG. 5 are bent in a direction (−z) opposite to a direction (z, see FIG. 1) in which the display region D faces a user to form the flexible display panel 100 shown in FIGS. 1 and 2. In the flexible display panel 100, when bending the non-display regions N1 and N3, curved surfaces (for example, having arc shapes) are formed at borders between the display region D and the non-display regions N1 and N3.

Referring back to FIG. 2, a border region RB having a curved surface is formed between the display region D (first region RI) and the non-display region N3 (second region RII). The border region RB is formed as a curved surface that has a curvature radius R+T.

In the embodiment of FIG. 2, the non-display region N3 of a second region RII extends from the border region RB. When the user looks at the bent flexible display panel 100 from the front direction (z) of the display region D, the user sees or recognizes the width $W_1$ of the non-display region N3 as the sum of the inner curvature radius R of a portion of the flexible display panel 100 where the display region D and the non-display regions N1 and N3 are bent and the thickness T of the flexible display panel 100. In the embodiment of FIG. 2, the width $W_1$ of the non-display region N3 that is seen or recognized by the user is the same as a width of the border region RB.

The thickness T of the flexible display panel 100 may be in the range of several tens of micrometers (μm) to several hundreds of micrometers (μm). In particular, in a small-sized display apparatus, since the thickness T may be selected from a relatively small range, the width $W_1$ of the non-display region N3 that is seen or recognized by the user may be further reduced. The present invention is not limited to the above-described range, and in other embodiments, the thickness T may be selected from a greater range, if appropriate.

Figure 9:
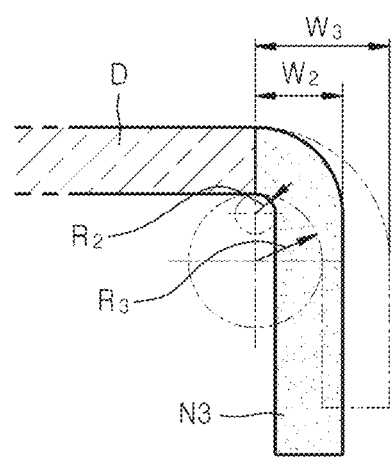
FIG. 9 shows the relationship between inner curvature radii of a portion of a flexible display panel in which a non-display region is bent, and widths of the non-display region that are seen or recognized by the user according to an embodiment of the present invention.

FIG. 9 shows the relationship between the inner curvature radii $R_2$ and $R_3$ of a portion of a flexible display panel in which a non-display region N3 is bent, and widths $W_2$ and $W_3$ of the non-display region N3 that are seen or recognized by the user according to an embodiment of the present invention.

Referring to FIG. 9, it is assumed that the thickness T of the flexible display panel 100 is constant. When the non-display region N3 is bent such that the border region RB has a curvature radius $R_2$, the width $W_2$ of the non-display region N3 that is seen or recognized by the user is the sum of the curvature radius $R_2$ and the thickness T of the flexible display panel ($W_2 = R_2 + T$). When the non-display region N3 is bent such that the border region RB has a greater curvature radius $R_3$ than the curvature radius $R_2$, the width $W_3$ of the non-display region N3 that is seen or recognized by the user is the sum of the curvature radius $R_3$ and the thickness T of the flexible display panel ($W_3 = R_3 + T$). That is, as the curvature radius $R_3$ is increased ($R_3 > R_2$), the width $W_3$ of the non-display region N3 that is seen or recognized by the user is increased.

The inner curvature radius R of the portion of the flexible display panel in which the display region D and the non-display region N3 are bent may be between 0.01 mm and 10 mm. When the inner curvature radius R of the portion of the flexible display panel 100 is less than 0.01 mm, due to a bending stress, the flexible display panel 100 may break or no longer stay bent. When the inner curvature radius R of the portion of the flexible display panel 100 is greater than 10 mm, the width $W_3$ of the non-display region N3 increases. In particular, in a small-sized display apparatus, the range of the curvature radius may be selected as being less than 1 mm so that the width $W_3$ of the non-display region N3 seen or recognized by the user may be further decreased.

Figure 10:
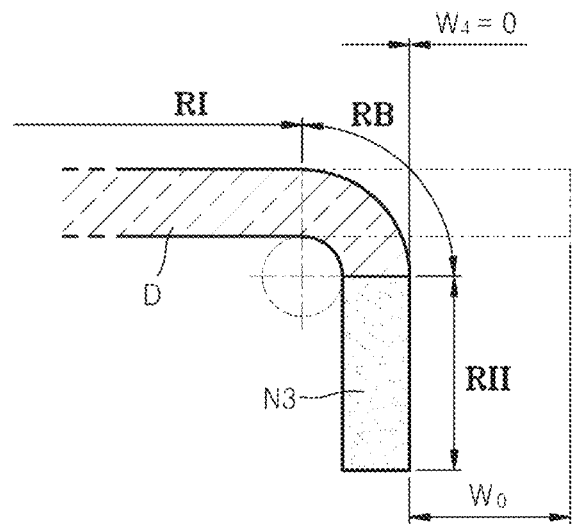
FIGS. 10 and 11 are cross-sectional views of examples of a border region.
Figure 11:
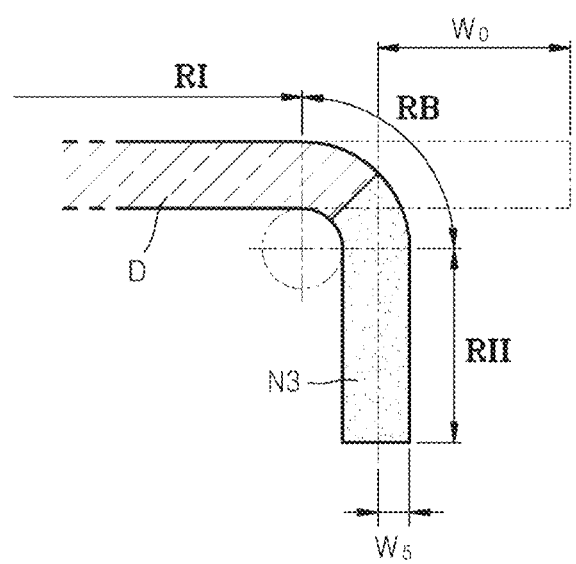

FIGS. 10 and 11 are cross-sectional views of examples of a border region RB.

Referring to FIG. 10, the display region D of a first region RI extends into the border region RB. When the user looks at the bent flexible display panel 100 from the front direction (z) of the display region D, a width $W_4$ of the non-display region N3 that is seen or recognized by the user is 0. Thus, the user sees or recognizes a borderless display region D.

Referring to FIG. 11, the display region D of the first region RI and the non-display region N3 of the second region RII may extend into the border region RB. In this case, a width $W_5$ of the non-display region N3 that is seen or recognized by the user is greater than the width $W_4$ (namely, 0) of the non-display region N3 that is seen or recognized by the user in FIG. 10 and is smaller than the width $W_1$ of the non-display region N3 that is seen or recognized by the user in FIG. 2 (assuming that the corresponding flexible display devices have the same thickness). In addition, the user sees or recognizes a smaller width of the non-display region N3 than in the flat display panel 10 of FIGS. 3 and 4 in which the non-display region N3 is not bent.

In the flexible display panel 100 shown in FIGS. 1 and 2, both the non-display regions N1 and N3 on the left and right portions of the display region D are bent. However, the present invention is not limited to this case. For example, in another embodiment, only one of the non-display regions N1 and N3 is bent.

Figure 12:
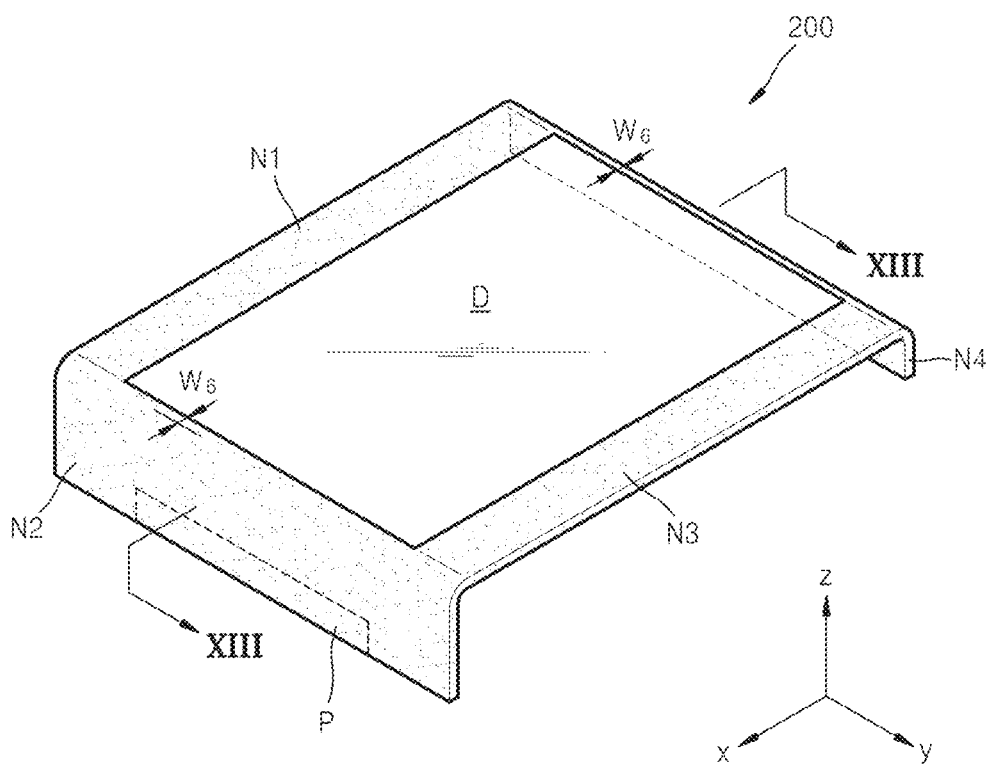
FIG. 12 is a schematic perspective view of a flexible display panel according to another embodiment of the present invention.
Figure 13:
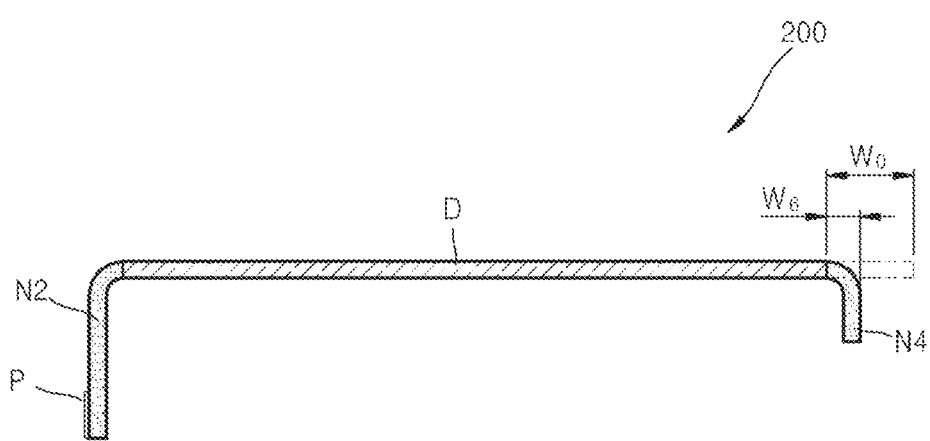
FIG. 13 is a cross-sectional view of the flexible display panel of FIG. 12 taken along the line XIII-XIII.
Figure 14:
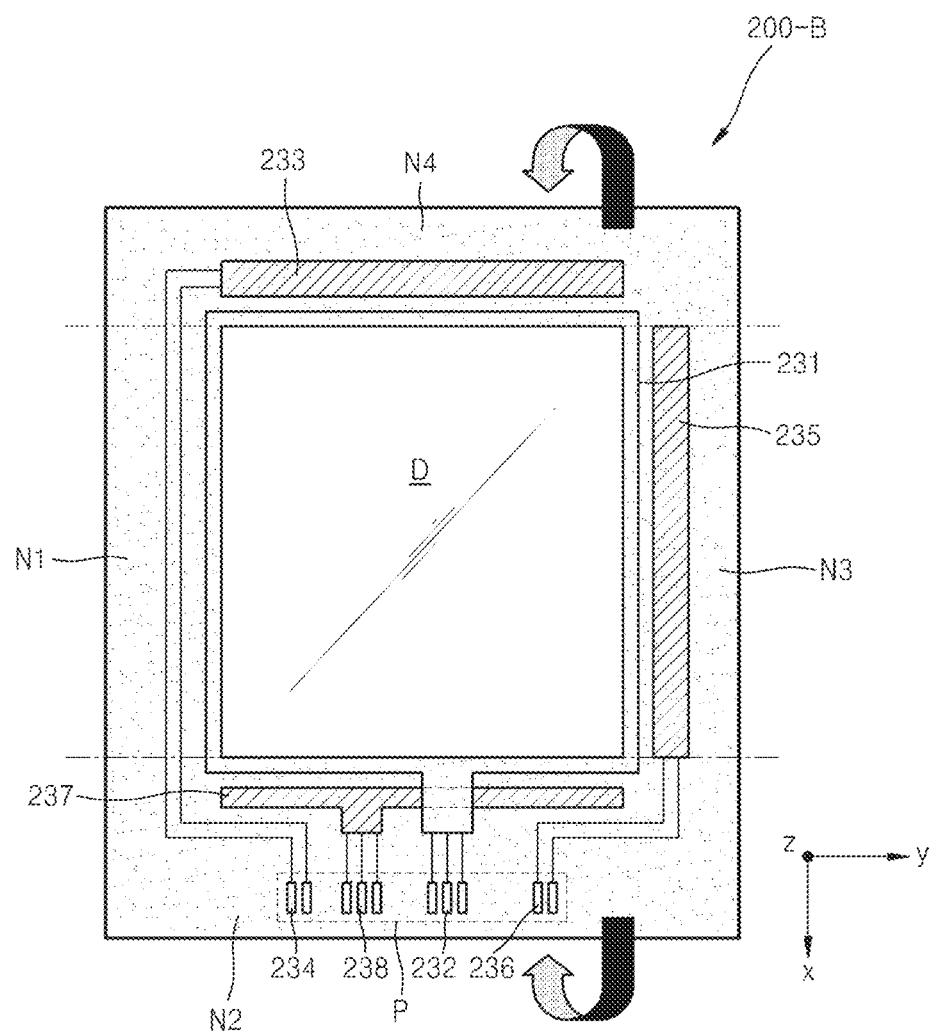
FIG. 14 is a schematic plan view of an example of the flexible display panel of FIG. 12 before bending non-display regions.

FIG. 12 is a schematic perspective view of a flexible display panel 200 according to another embodiment of the present invention. FIG. 13 is a cross-sectional view of the flexible display panel 200 of FIG. 12 taken along the line XIII-XIII. FIG. 14 is a schematic plan view of a flexible display panel 200-B, which is an example of the flexible display panel 200 of FIG. 12 before bending the non-display regions N2 and N4. It should be noted that in the embodiments of FIGS. 12-14, the original (unbent) width of the non-display region N2 is larger than the original (unbent) width $W_0$ of the non-display region N4.

Hereinafter, the flexible display panel 200 will be described in terms of the differences from the flexible display panel 100 of FIGS. 1 and 2. In addition, the flexible display panel 200-B will be described in terms of the differences from the flexible display panel 100-B of FIG. 5. In particular, an electrode power supply line 231 and a terminal portion 232 of the electrode power supply line 231, a scan circuit unit 233 and a terminal portion 234 of the scan circuit unit 233, a data circuit unit 235 and a terminal portion 236 of the data circuit unit 235, and a driving power wiring unit 237 and a terminal portion 238 of the driving power wiring unit 237 of the flexible display panel 200-B are substantially similar to the electrode power supply line 131 and the terminal portion 132 of the electrode power supply line 131, the scan circuit unit 133 and the terminal portion 134 of the scan circuit unit 133, the data circuit unit 135 and the terminal portion 136 of the data circuit unit 135, and the driving power wiring unit 137 and the terminal portion 138 of the driving power wiring unit 137, respectively, of the flexible display panel 100-B, so further description of these components will not be repeated.

Referring to FIG. 14, in the flexible display panel 200-B, the non-display regions N2 and N4 on lower and upper portions of the display region D are bent in a direction (−z) opposite to a direction (z) in which the display region D is displayed to a user. This forms the flexible display panel 200 of FIG. 12.

Referring to FIGS. 12 and 13, the flexible display panel 200 includes the display region D and the non-display regions N1, N2, N3, and N4 outside the display region D. The non-display regions N2 and N4 that face each other across the display region D in lower and upper directions among the non-display regions N1, N2, N3, and N4 are bent in a direction (−z) opposite to a direction (z) in which the display region D is displayed. Since the non-display regions N2 and N4 are bent in the direction (−z) opposite to the direction (z) in which the display region D is displayed, when the user looks at the flexible display panel 200 from the front direction (z) of the display region D, the user sees or recognizes a width $W_6$ of a portion of the flexible display panel 200 in which the non-display regions N2 and N4 are bent as a border that surrounds or bounds lower and upper sides of the display region D.

As described above, since the width $W_6$ of the portion of the flexible display panel 200 in which the non-display regions N2 and N4 are bent becomes much smaller than an original (unbent) width $W_0$ of the non-display region N4 (and even smaller than the original (unbent) width of the non-display region N2), the user sees or recognizes that the border of the display region D formed by the non-display regions N2 and N4 is significantly decreased in size. In particular, since the non-display region N2, which is occupied by the pad unit P, is wide (i.e., wider than the other non-display regions N1, N3, and N4), the user sees or recognizes that the border of the display region D formed by the non-display region N2 is significantly decreased in size by bending the non-display region N2.

Figure 15:
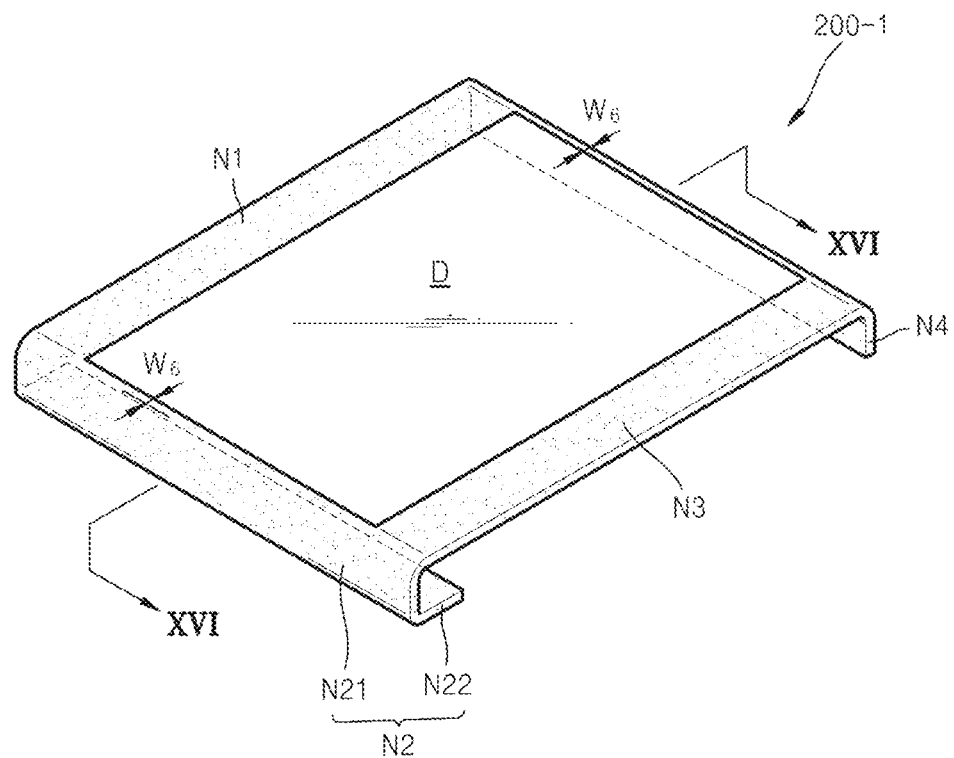
FIG. 15 is a schematic perspective view of a flexible display panel according to another embodiment of the present invention.
Figure 16:
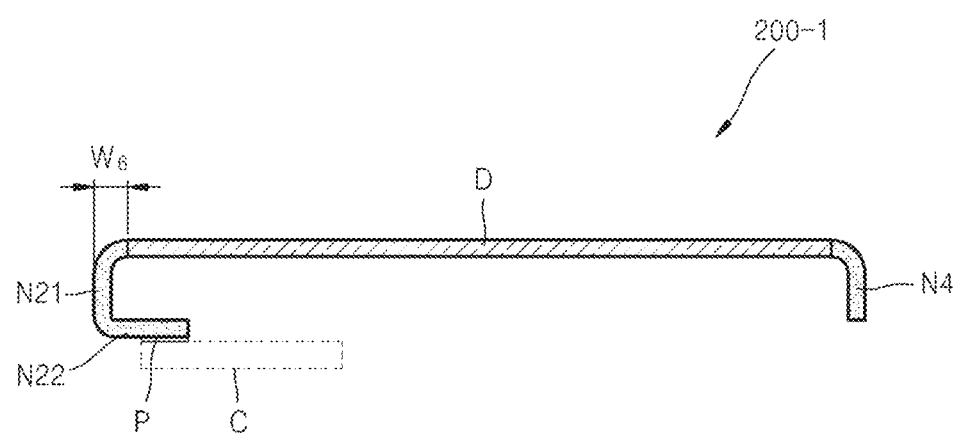
FIG. 16 is a cross-sectional view of the flexible display panel of FIG. 15 taken along the line XVI-XVI.

FIG. 15 is a schematic perspective view of a flexible display panel 200-1 according to another embodiment of the present invention. FIG. 16 is a cross-sectional view of the flexible display panel 200-1 of FIG. 15 taken along the line XVI-XVI. The flexible display panel 200-1 is similar to the flexible display panel 200 of FIGS. 12 and 13. Accordingly, the description of similar components may not be repeated.

Referring to FIGS. 15 and 16, compared with the flexible display panel 200 of FIGS. 12 and 13, non-display region N2 of the flexible display panel 200-1 is divided into two portions, specifically (1) a non-display region N21 that is bent once with respect to the display region D to face and appear similar to the non-display region N4, and (2) a non-display region N22, in which the pad unit P is located, that is bent once with respect to the non-display region N21 and twice with respect to (and to face) the display panel D. The non-display region N22 faces toward the inner area of the flexible display panel 200-1. That is, the non-display region N22 is parallel to or substantially parallel to the display region D.

Since an external driver may need to be installed on the pad unit P, or a connector C may need to be connected to the pad unit P, if the external driver is installed on (or the connector C is connected to) the pad unit P in the flexible display panel 200 of FIGS. 12 and 13, the width $W_6$ of the non-display region N2 seen or recognized by the user may be increased. However, in the flexible display panel 200-1 of FIGS. 15 and 16, when the non-display region N22 of the non-display region N2, in which the pad unit P is located, is bent toward the inside of the flexible display panel 200-1 once more, the external driver or the connector C is located inside the flexible display panel 200-1, and thus, the width $W_6$ of the non-display region N2 seen or recognized by the user is not changed.

In the embodiment of FIG. 16, the pad unit P is located in the bent non-display region N22, but the present invention is not limited thereto. In other embodiments, the above described various circuits and wirings may instead or in addition be located in the bent non-display region N22.

Figure 17:
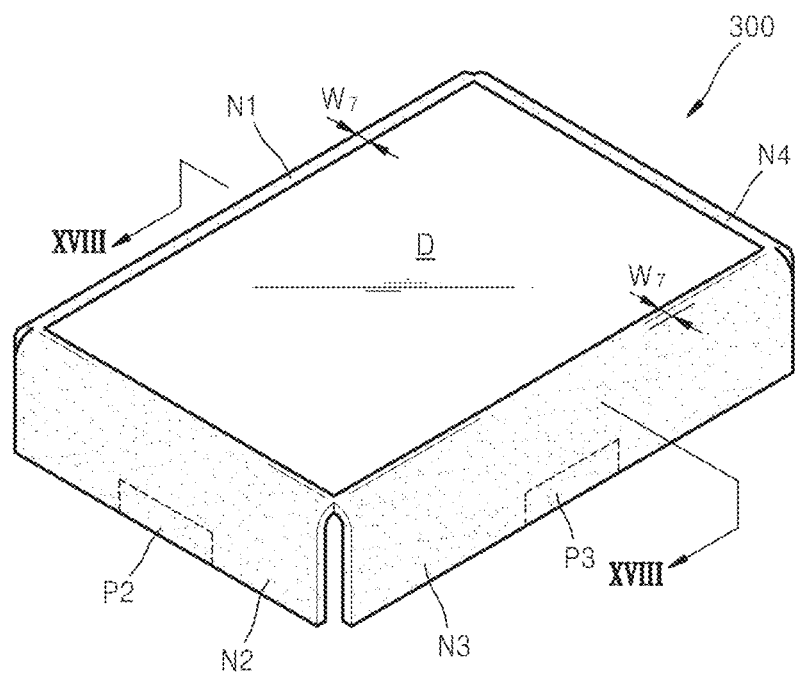
FIG. 17 is a schematic perspective view of a flexible display panel according to another embodiment of the present invention.
Figure 18:
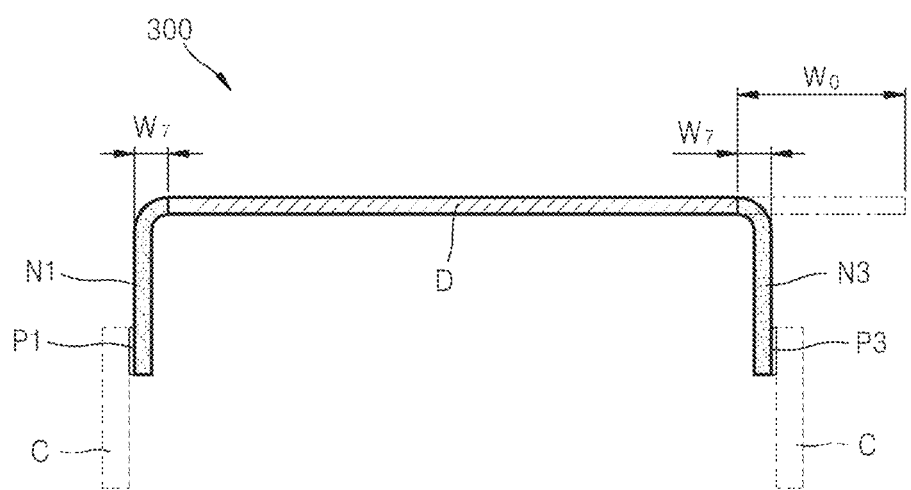
FIG. 18 is a cross-sectional view of the flexible display panel taken along the line XVIII-XVIII of FIG. 17.
Figure 19:
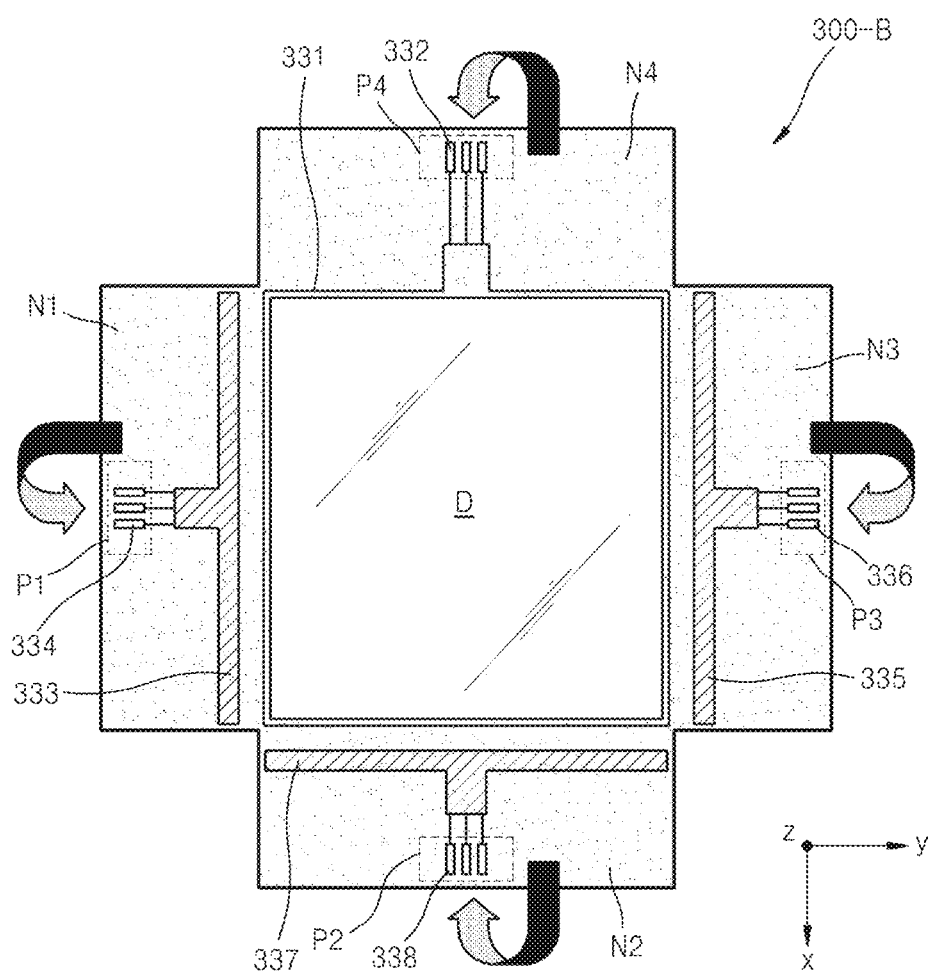
FIG. 19 is a schematic plan view of an example of the flexible display panel of FIG. 17 before bending the non-display regions.

FIG. 17 is a schematic perspective view of a flexible display panel 300 according to another embodiment of the present invention. FIG. 18 is a cross-sectional view of the flexible display panel 300 of FIG. 17 taken along the line XVIII-XVIII. FIG. 19 is a schematic plan view of a flexible display panel 300-B, which is an example of the flexible display panel 300 of FIG. 17 before bending non-display regions N1, N2, N3, and N4.

Hereinafter, the flexible display panel 300 will be described in terms of the differences from the flexible display panel 100 of FIGS. 1 and 2 and the flexible display panel 200 of FIGS. 12 and 13. In addition, the flexible display panel 300-B will be described in terms of the differences from the flexible display panel 100-B of FIG. 5 and the flexible display panel 200-B of FIG. 14. In particular, an electrode power supply line 331 and a terminal portion 332 of the electrode power supply line 331, a scan circuit unit 333 and a terminal portion 334 of the scan circuit unit 333, a data circuit unit 335 and a terminal portion 336 of the data circuit unit 335, and a driving power wiring unit 337 and a terminal portion 338 of the driving power wiring unit 337 of the flexible display panel 300-B are substantially similar to the electrode power supply line 131 and the terminal portion 132 of the electrode power supply line 131, the scan circuit unit 133 and the terminal portion 134 of the scan circuit unit 133, the data circuit unit 135 and the terminal portion 136 of the data circuit unit 135, and the driving power wiring unit 137 and the terminal portion 138 of the driving power wiring unit 137, respectively, of the flexible display panel 100-B (and likewise for identically named and similarly numbered components of the flexible display panel 200-B), so further description of these components will not be repeated.

Further, the pad unit P of the flexible display panel 100-B and the flexible display panel 200-B is replaced with pad units P1, P2, P3, and P4 on the non-display regions N1, N2, N3, and N4 and corresponding to the terminal portions 334, 338, 336, and 332 of the scan circuit unit 333, the driving power wiring unit 337, the data circuit unit 335, and the electrode power supply line 331, respectively, of the flexible display panel 300-B.

Referring to FIG. 19, the non-display regions N1, N2, N3, and N4 that face each other across the display region D in left, lower, right, and upper directions, respectively, of the display region D are bent in a direction (−z) opposite to a direction (z) in which the display region D is displayed to the user. This forms the flexible display panel 300 shown in FIG. 17.

Referring to FIGS. 17 and 18, the flexible display panel 300 includes the display region D and the non-display regions N1, N2, N3, and N4 outside the display region D. The non-display regions N1 and N3 that face each other across the display region D in the left and right directions, and the non-display regions N2 and N4 that face each other across the display region D in the lower and upper directions of the display region D are bent in the direction (−z) opposite to the direction (z) in which the display region D is displayed. Since the non-display regions N1, N2, N3, and N4 are bent in the direction (−z) opposite to the direction (z) in which the display region D is displayed, when the user looks at the flexible display panel 300 from the front direction (z) of the display region D, the user sees or recognizes a width $W_7$ of a portion of the flexible display panel 300 in which the non-display regions N1 and N3, and N2 and N4 are bent as a border that surrounds or bounds left and right, and lower and upper sides, respectively, of the display region D.

As described above, since the width $W_7$ of the portion of the flexible display panel 300 in which the non-display regions N1, N2, N3, and N4 are bent becomes much smaller than an original (unbent) width $W_0$ of the non-display regions N1, N2, N3, and N4, the user sees or recognizes that the border of the display region D formed by the non-display regions N1, N2, N3, and N4 is significantly decreased in size. In particular, since the non-display regions N1, N2, N3, and N4, which are occupied by the pad units P1, P2, P3, and P4, are wide, the user sees or recognizes that the border of the display region D formed by the non-display regions N1, N2, N3, and N4 is significantly decreased in size by bending the non-display regions N1, N2, N3, and N4.

Figure 20:
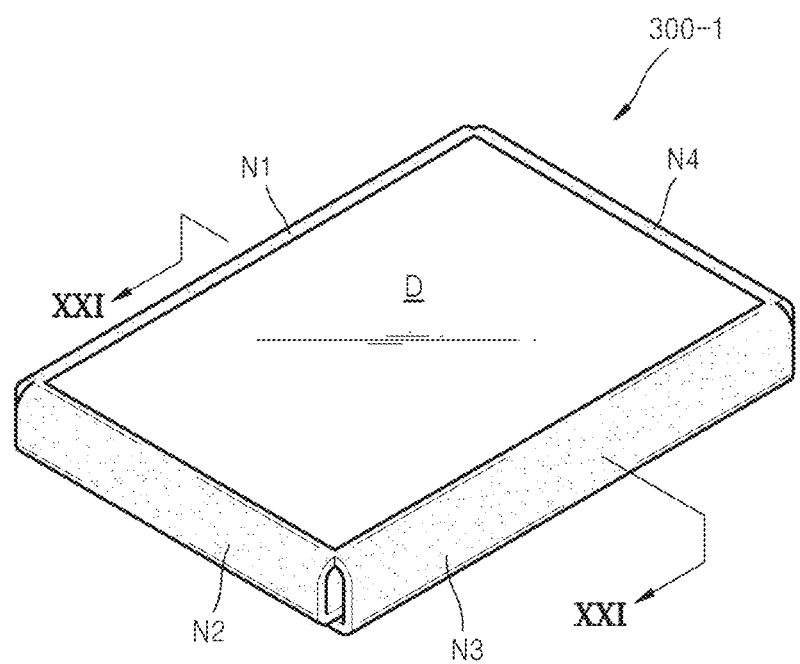
FIG. 20 is a schematic perspective view of a flexible display panel according to another embodiment of the present invention.
Figure 21:
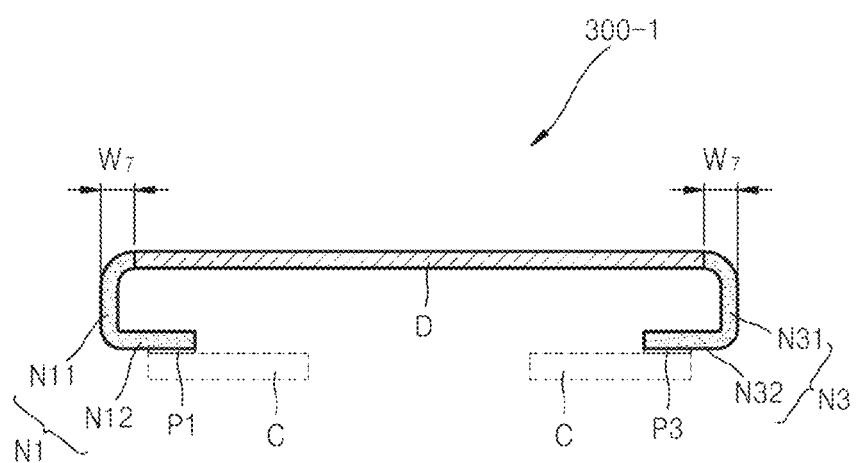
FIG. 21 is a cross-sectional view of the flexible display panel of FIG. 20 taken along the line XXI-XXI.

FIG. 20 is a schematic perspective view of a flexible display panel 300-1 according to another embodiment of the present invention. FIG. 21 is a cross-sectional view of the flexible display panel 300-1 of FIG. 20 taken along the line XXI-XXI. The flexible display panel 300-1 is similar to the flexible display panel 300 of FIGS. 12 and 13. Accordingly, the description of similar components may not be repeated.

Referring to FIGS. 20 and 21, compared with the flexible display panel 300 of FIGS. 17 and 18, each of the non-display regions N1, N2, N3, and N4 of the flexible display panel 300-1 is divided into two portions, specifically (1) a first non-display region (for example, first non-display regions N11 and N31 for the non-display regions N1 and N3, respectively) that is bent once with respect to the display region D, and (2) a second non-display region (for example, second non-display regions N12 and N32 for the non-display regions N1 and N3, respectively), in which a corresponding one of the pad units P1, P2, P3, and P4 is located, that is bent once with respect to the first non-display region and twice with respect to (and to face) the display panel D. Each of the second non-display regions faces toward an inner area of the flexible display panel 300-1. That is, each of the second non-display regions is parallel to or substantially parallel to the display region D.

An external driver may need to be installed on one or more pad units P1, P2, P3, and/or P4, or a connector C may need to be connected to one or more pad units P1, P2, P3, and/or P4. If the external driver is installed on (or the connector C is connected to) one or more of the pad units P1, P2, P3, and/or P4 in the flexible display panel 300 of FIGS. 17 and 18, the width $W_7$ of corresponding ones of the non-display regions N1, N2, N3, and/or N4 seen or recognized by the user may be increased. However, in the flexible display panel 300-1 of FIGS. 20 and 21, when the second non-display regions (for example, second non-display regions N12 and N32) of the non-display regions N1, N2, N3, and N4, in which the pad units P1, P2, P3, and P4 are respectively located, are bent toward an inner area the flexible display panel 300-1 once more, the corresponding external driver or the corresponding connector C is located inside the flexible display panel 300-1, and thus, the width $W_7$ of each of the non-display regions N1, N2, N3, and N4 seen or recognized by the user is not changed.

In the embodiment of FIG. 21, the pad units P1 and P3 are located in the bent second non-display regions N12 and N32, but the present invention is not limited thereto. In other embodiments, the above-described various circuits and wirings may instead or in addition be located in the bent second non-display regions N12 and N32 (and likewise for the pad units P2 and P4 located in the bent second non-display regions of the non-display regions N2 and N4).

Figure 22:
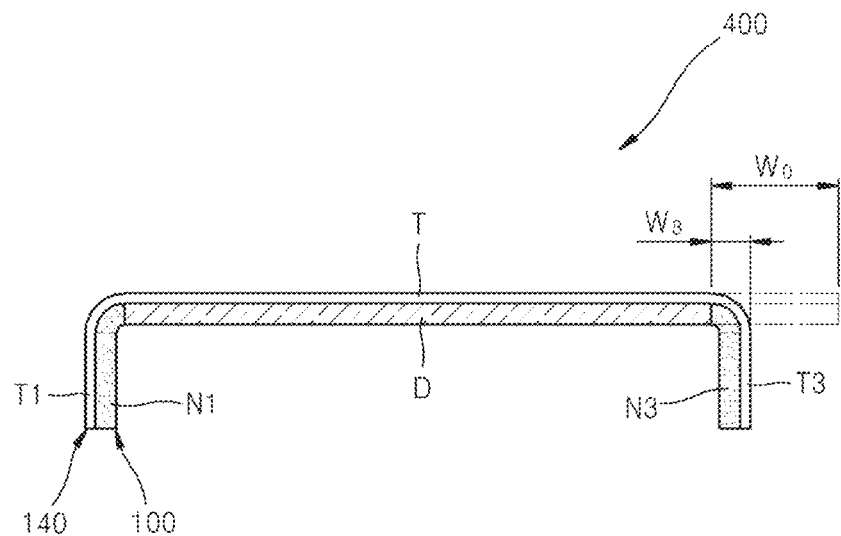
FIG. 22 is a cross-sectional view of a flexible display panel with integrated touch panel according to another embodiment of the present invention.
Figure 23:
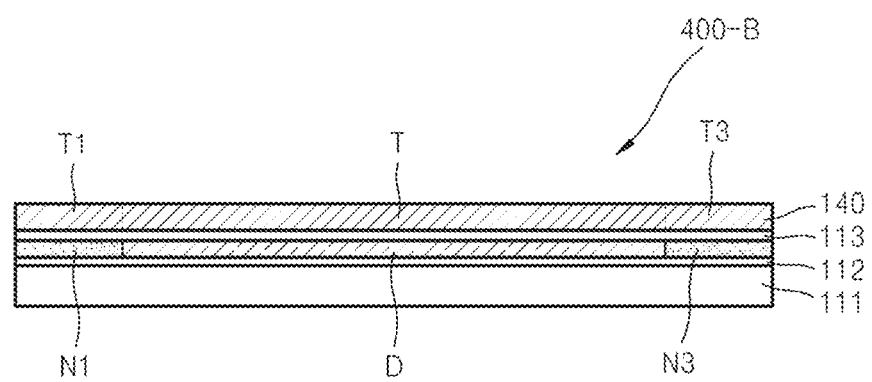
FIG. 23 is a cross-sectional view of an example of the flexible display panel with integrated touch panel of FIG. 22 before bending non-display regions.
Figure 24:
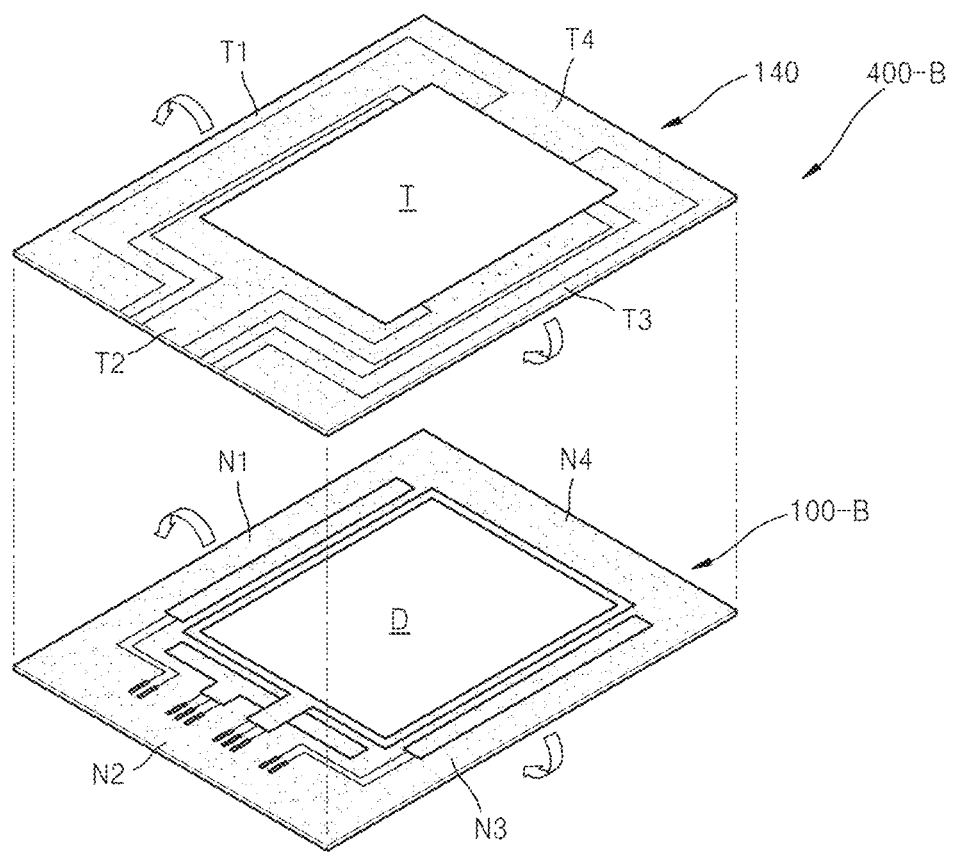
FIG. 24 is an exploded perspective view of the flexible display panel with integrated touch panel of FIG. 23.

FIG. 22 is a cross-sectional view of a flexible display panel with integrated touch panel 400 according to another embodiment of the present invention. FIG. 23 is a cross-sectional view of a flexible display panel with integrated touch panel 400-B, which is an example of the flexible display panel with integrated touch panel 400 of FIG. 22 before bending non-display regions N1 and N3. FIG. 24 is an exploded perspective view of the flexible display panel with integrated touch panel 400-B of FIG. 23.

Hereinafter, the flexible display panel with integrated touch panel 400 will be described in terms of differences from the flexible display panel 100 of FIGS. 1 and 2, the flexible display panel 200 of FIGS. 12 and 13, and the flexible display panel 300 shown in FIGS. 17 and 18. Further, the flexible display panel with integrated touch panel 400-B will be described in terms of differences from the flexible display panel 100-B of FIG. 5, the flexible display panel 200-B of FIG. 14, and the flexible display panel 300-B of FIG. 19.

Referring to FIGS. 22-24, the flexible display panel with integrated touch panel 400 is obtained by adding a touch panel 140 to the flexible display panel 100 of FIGS. 1 and 2. The touch panel 140 includes a touch region T and wiring regions T1, T2, T3, and T4 outside the touch region T. In the embodiment of FIGS. 22-24, the touch panel 140 may use one or more of a variety of touch methods, such as a capacitance overlay, a resistance film, or the like, as would be apparent to one of ordinary skill in the art. The touch panel 140 may also include a flexible film that can be bent to correspond to a shape of the flexible display panel.

A flexible display panel 100-B before one or more of non-display regions N1, N2, N3, and N4 are bent (for example, non-display regions N1 and N3) includes a display region D and the non-display regions N1, N2, N3, and N4 outside the display region D. The touch panel 140 and the flexible display panel 100-B are aligned with each other so that the touch region T corresponds to the display region D after the touch panel 140 and the flexible display panel 100-B are combined (for example, joined or mated).

In the flexible display panel 100-B combined with the touch panel 140, the non-display regions N1 and N3 of the flexible display panel 100-B, which are on left and right sides of the display region D, are bent in a direction opposite to a direction in which the display region D is displayed to the user. This forms the flexible display panel with integrated touch panel 400 of FIG. 22. Since the non-display regions N1 and N3, and the wiring regions T1, T2, T3 and T4 of the touch panel 140 are bent in the direction (−z) opposite to the direction (z) in which the display region D is displayed, when the user looks at the flexible display panel with integrated touch panel 400 from the front direction (z) of the display region D, the user sees or recognizes a width $W_8$ of a portion of the flexible display panel with integrated touch panel 400 in which the non-display regions N1 and N3 are bent as a border that surrounds or bounds the left and right sides of the display region D.

As described above, since the width $W_8$ of the portion of the flexible display panel with integrated touch panel 400 in which the non-display regions N1 and N3 are bent becomes much smaller than an original width $W_0$ before bending the non-display regions N1 and N3, the user sees or recognizes that the border of the display region D formed by the non-display regions N1 and N3 is significantly decreased in size. Although the flexible display panel 100-B illustrated in FIG. 5 is shown in the drawings described above, the present invention is not limited thereto. In other embodiments, aspects of the present embodiment may also be applied to, for example, the flexible display panel 100 of FIGS. 1 and 2, the flexible display panel 200 of FIGS. 12 and 13, the flexible display panel 100-B of FIG. 14, the flexible display panel 200-1 of FIGS. 15 and 16, the flexible display panel 300 shown in FIGS. 17-18, the flexible display panel 300-B of FIG. 19, or the flexible display panel 300-1 of FIGS. 20-21.

Figure 25:
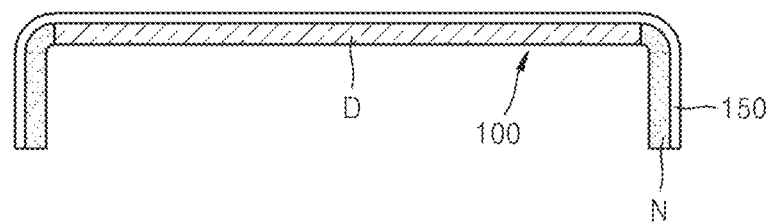
FIGS. 25 through 27 are schematic cross-sectional views of a flexible display panel having various support members.
Figure 26:
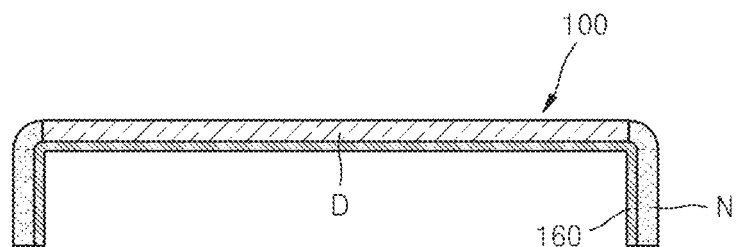
Figure 27:
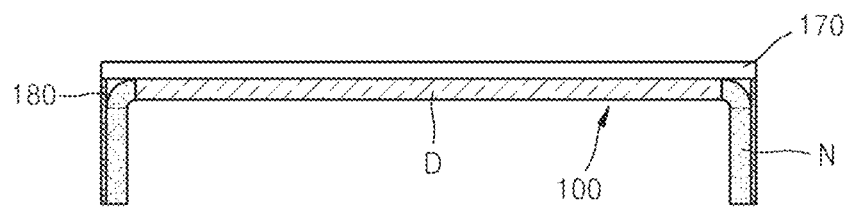

FIGS. 25 through 27 are schematic cross-sectional views of a flexible display panel 100 having various support members. For convenience of explanation, the flexible display panel 100 is exemplified. However, the present invention is not limited thereto and in other embodiments, may be applied to, for example, the flexible display panel with integrated touch panel 400 or any of the other above-described embodiments.

Referring to FIG. 25, the flexible display panel 100 in which a non-display region N is bent is protected and supported by a transparent protection window 150. The transparent protection window 150 is attached to the flexible display panel 100 to correspond to a shape of the flexible display panel 100, e.g., to correspond to a top surface of the flexible display panel 100 on which an image is displayed, and to a bent shape of the flexible display panel 100. That is, the transparent protection window 150 may be combined with (for example, adhered to) the flexible display panel 100 to correspond to shapes of the display region D and the non-display region N of the flexible display panel 100. The transparent protection window 150 has light transmittance that allows light to transmit to or from a display screen of the flexible display panel 100, and has strength that strengthens or prevents the flexible display panel 100 from being deformed due to, for example, a bending force on or a restoring force of the flexible display panel 100. Thus, the transparent protection window 150 protects the flexible display panel 100 from external shock or scratches and functions as a support unit for maintaining a shape of the flexible display panel 100. An adhesive or the like may be further located between the flexible display panel 100 and the transparent protection window 150.

FIG. 25 shows the transparent protection window 150 directly on the flexible display panel 100. However, the present invention is not limited thereto and in other embodiments, may also be applied to, for example, the flexible display panel with integrated touch panel 400. In addition, the transparent protection window 150 may be combined with a flexible display panel and/or a bent shape of the flexible display panel.

FIG. 26 shows an internal surface of the flexible display panel 100 having a bent non-display region that is supported by a support member 160. The support member 160 has a resistance that strengthens or prevents the flexible display panel 100 from being deformed due to a bending force on or a restoring force of the flexible display panel 100. An adhesive or the like may be further located between the flexible display panel 100 and the support member 160.

FIG. 27 shows the flexible display panel 100 in which a non-display region is bent being supported or protected by a transparent protective window 170 that has a flat shape instead of a curved surface shape. Lateral surfaces of a bent portion of the flexible display panel 100 are also supported by a bezel or frame 180. An adhesive or the like may be further located between the flexible display panel 100 and the transparent protective window 170, and/or between the flexible display panel 100 and the bezel or frame 180.

The above-described support units are just illustrative of a unit for supporting and/or protecting a bent shape of a flexible display panel in which a non-display region is bent. In other embodiments, various applications of support units may be used as would be apparent to one of ordinary skill in the art.

As described above, the flexible display panel that has a concave curved shape maintained by various support units may be integrated with various display apparatuses, such as TVs, computer monitors, PDAs, smartphones, or the like. Thus, the area ratio of non-display regions to a display region of the flexible display panel seen or recognized by a user is significantly decreased so that an enlarged image screen compared to other display apparatuses is provided.

A display apparatus according to embodiments of the present invention has useful features. For example, by bending a non-display region in a direction opposite to a direction in which a display region is displayed, a border of the non-display region seen or recognized by a user may be significantly decreased in size. In addition, protective films are formed on upper and lower portions of a flexible display panel to cover regions in which a metal layer is formed, thereby reducing or preventing wirings from cracking due to a bending stress.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A display apparatus comprising:
a first protective film;
a substrate on the first protective film;
a display region on a first plane of the substrate;
a first non-display region disposed on a second plane of the substrate, wherein the second plane is bent with respect to the first plane;
a second non-display region adjacent to the first non-display region, wherein the second non-display region is disposed on a third plane of the substrate, and wherein the third plane is bent with respect to the first plane;
a border region between the display region and the first and second non-display regions, the border region extending from the display region and being configured to display an image;
an encapsulation member on the display region, the encapsulation member comprising layers stacked in an order of an inorganic layer, an organic layer and an inorganic layer;
a second protective film on the encapsulation member;
a protection window on the encapsulation member; and
an adhesive between the second protective film and the protection window,
wherein an edge of the first protective film is spaced apart from an edge of the second protective film, and
wherein a corner between the first and second non-display regions is cut off.

2. The display apparatus of claim 1, wherein a portion of the first non-display region or a portion of the second non-display region is bent to face the display region.

3. The display apparatus of claim 2, wherein the portion of the first non-display region or the portion of the second non-display region includes a pad unit.

4. The display apparatus of claim 1, wherein the border region has a curved shape.

5. The display apparatus of claim 1, further comprising a touch region and touch wirings in wiring regions outside the touch region, the touch region and the touch wirings being disposed on the encapsulation member,
wherein the touch region is disposed on the display region and the border region, and
wherein the touch wirings are disposed on at least one selected from among the first non-display region and the second non-display region.

6. The display apparatus of claim 5, wherein the touch region and the touch wirings are bent to correspond to shapes of the display region, the border region, and the first and second non-display regions.

7. The display apparatus of claim 1, wherein the first protective film and the second protective film are arranged to be symmetrical with each other.

8. The display apparatus of claim 1, wherein the second protective film comprises a polarization film.

9. The display apparatus of claim 1, wherein the protection window is bent to correspond to shapes of the display region, the border region, and the first and second non-display regions.

10. The display apparatus of claim 1, wherein the protection window functions as a support unit for maintaining shapes of the display region and the first and second non-display regions.

11. The display apparatus of claim 1, further comprising an electrode power supply line disposed on the second non-display region,
wherein the display region and the border region comprise an organic light-emitting device comprising a pixel electrode, an organic emission layer and an opposite electrode, and
wherein the electrode power supply line is configured to supply power to the opposite electrode.

12. The display apparatus of claim 1, wherein the substrate comprises a flexible material.

13. A display apparatus comprising:
a first protective film;
a substrate on the first protective film;
a display region on a first plane of the substrate;
a first non-display region disposed on a second plane of the substrate, wherein the second plane is bent with respect to the first plane;
a second non-display region adjacent to the first non-display region, wherein the second non-display region is disposed on a third plane of the substrate, and wherein the third plane is bent with respect to the first plane;
a third non-display region adjacent to the second non-display region, wherein the third non-display region is disposed on a fourth plane of the substrate, and wherein the fourth plane is bent with respect to the first plane;
a fourth non-display region adjacent to the third non-display region, wherein the fourth non-display region is disposed on a fifth plane of the substrate, and wherein the fifth plane is bent with respect to the first plane;
an encapsulation member on the display region, the encapsulation member comprising layers stacked in an order of an inorganic layer, an organic layer and an inorganic layer;
a second protective film on the encapsulation member;
a protection window on the encapsulation member; and
an adhesive between the second protective film and the protection window,
wherein corners between the first to fourth non-display regions are cut off.

14. The display apparatus of claim 13, further comprising at least one border region between the display region and the first to fourth non-display regions, the at least one border region extending from the display region and being configured to display an image.

15. The display apparatus of claim 14, further comprising a touch region and touch wirings in wiring regions outside the touch region being, the touch region and the touch wirings being disposed on the encapsulation member,
wherein the touch region is disposed on the display region and the at least one border region, and
wherein the touch wirings are disposed on at least one selected from among the first to fourth non-display regions.

16. The display apparatus of claim 13, wherein an edge of the first protective film is spaced apart from an edge of the second protective film.

17. The display apparatus of claim 13, wherein the first protective film and the second protective film are arranged to be symmetrical with each other.

18. The display apparatus of claim 13, wherein the second protective film comprises a polarization film.

19. The display apparatus of claim 13, further comprising an electrode power supply line disposed on at least one selected from among the first to fourth non-display regions,
wherein the display region comprises an organic light-emitting device comprising a pixel electrode, an organic emission layer and an opposite electrode, and
wherein the electrode power supply line is configured to supply power to the opposite electrode.

20. The display apparatus of claim 13, wherein the substrate comprises a flexible material.

* * * * *